United States Patent
Kubota et al.

(10) Patent No.: US 6,465,806 B2
(45) Date of Patent: *Oct. 15, 2002

(54) SEMICONDUCTOR DEVICE, DISPLAY DEVICE, AND METHOD FOR PRODUCING A SEMICONDUCTOR DEVICE

(75) Inventors: Yasushi Kubota, Sakurai (JP); Ichiro Shiraki, Tenri (JP); Tamotsu Sakai, Tenri (JP); Zhang Hongyong, Atsugi (JP); Jun Koyama, Atsugi (JP)

(73) Assignees: Sharp Kabushiki Kaisha, Osaka (JP); Semiconductor Energy Laboratory Co., Ltd, Kanagawa-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/095,587

(22) Filed: Jun. 11, 1998

(65) Prior Publication Data

US 2001/0019128 A1 Sep. 6, 2001

(30) Foreign Application Priority Data

Jun. 11, 1997 (JP) .............................................. 9-154119

(51) Int. Cl.$^7$ .............................................. H01L 29/04
(52) U.S. Cl. ........................................ 257/72; 257/758
(58) Field of Search .......................... 257/758, 72, 774, 257/776; 438/622

(56) References Cited

U.S. PATENT DOCUMENTS

| | | | | | |
|---|---|---|---|---|---|
| 4,289,574 | A | * | 9/1981 | Radigan et al. | 156/643 |
| 4,713,682 | A | * | 12/1987 | Erie et al. | 257/774 |
| 5,869,393 | A | * | 2/1999 | Tseng | 438/622 |
| 5,955,744 | A | | 9/1999 | Gu et al. | 257/59 |
| 6,040,589 | A | | 2/2000 | Zhang et al. | 257/59 |
| 6,121,683 | A | | 9/2000 | Yamazaki et al. | 257/734 |

FOREIGN PATENT DOCUMENTS

JP   8-203998 A   8/1996

OTHER PUBLICATIONS

Itoh et al., "4.1: High–Resolution Low–Temperature Poly–Si TFT–LCDs Using a Novel Structure with TFT Capacitors", SID 96 Digest of Technical Papers, SID International Symposium, May, 1996, pp. 17–20.

* cited by examiner

Primary Examiner—Mark V. Prenty
(74) Attorney, Agent, or Firm—Nixon & Vanderhye P.C.

(57) ABSTRACT

A semiconductor device includes a first conductive layer; an interlayer insulative layer having an opening; and a second conductive layer. The first conductive layer, the interlayer insulative layer and the second conductive layer are sequentially laminated. The opening is partially covered by the second conductive layer, and an area of the first conductive layer is substantially entirely covered by the second conductive layer in the opening.

11 Claims, 16 Drawing Sheets

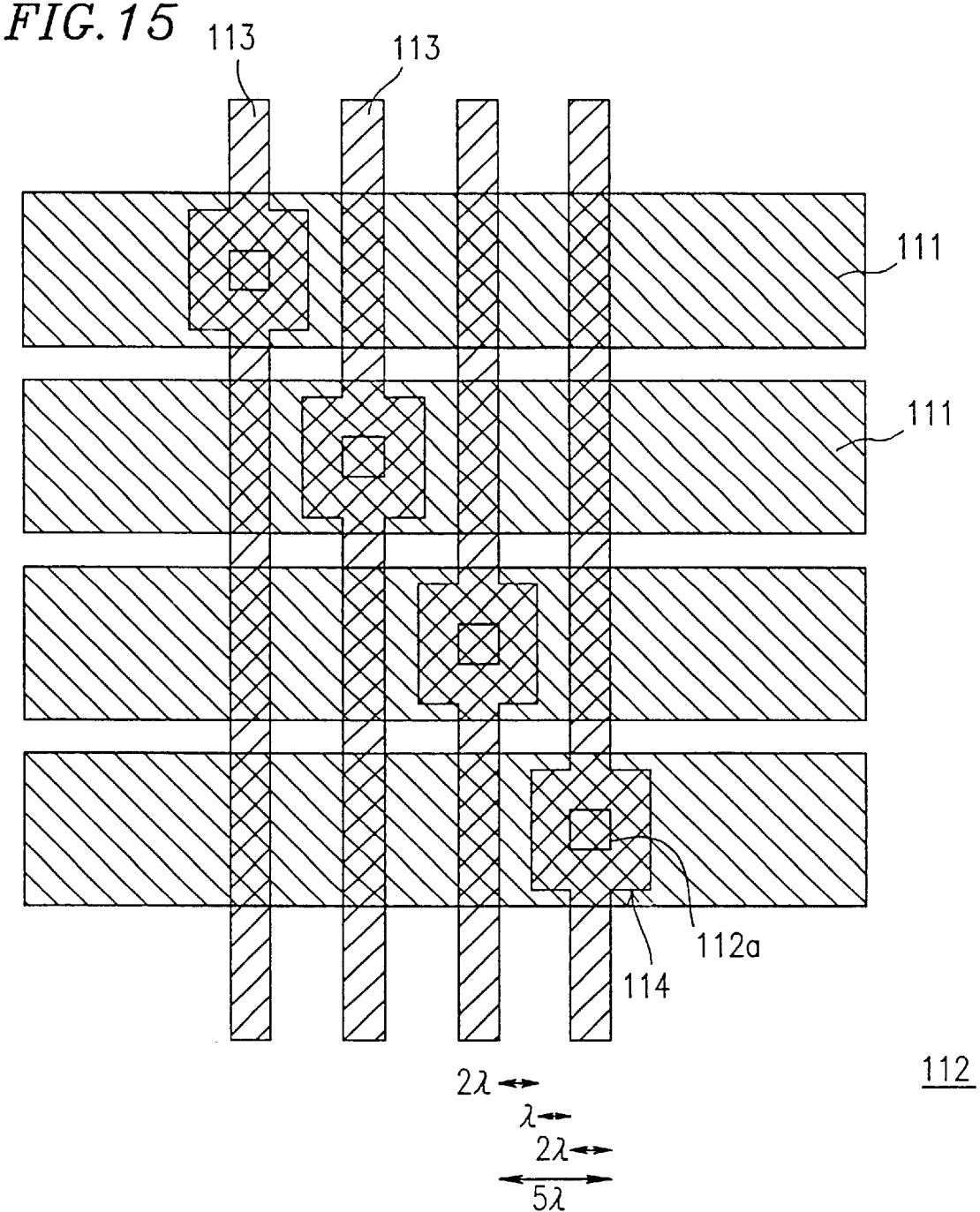

SEMICONDUCTOR DEVICE, DISPLAY DEVICE, AND METHOD FOR PRODUCING A SEMICONDUCTOR DEVICE

BACKGROUND OF THE INVENTION

1. Field of the Invention

The present invention relates to a semiconductor device including a connection structure having two conductive patterns connected to each other through an insulative layer, a method for producing the same, and a display device including such a connection structure.

2. Description of the Related Art

As is well-known, there are various types of semiconductor devices. One type of semiconductor device is an active matrix liquid crystal display device. FIG. 13 is a block diagram illustrating an exemplary structure of a conventional active matrix liquid crystal display device.

The active matrix liquid crystal display device shown in FIG. 13 includes two substrates located opposed to each other and a liquid crystal layer interposed therebetween (not shown). One of the substrates (represented by chain line 110) includes a plurality of scanning lines 101 and a plurality of signal lines 102 which are arranged perpendicular to each other. A pixel electrode 103 is provided at each of intersections of the scanning lines 101 and the signal lines 102. Although not shown, the other substrate includes a counter electrode facing the pixel electrodes 103. The pixel electrodes 103 arranged along each scanning line 101 are commonly connected to the scanning line 101 via corresponding switching elements, and the pixel electrodes 103 arranged along each signal line 102 are commonly connected to the signal line 102 via corresponding switching elements.

The liquid crystal display device shown in FIG. 13 further includes a scanning line driving circuit 104, a control circuit 105, a voltage generation circuit 106, and a signal line driving circuit 107.

In one horizontal scanning period, the scanning line driving circuit 104 selects one of the scanning lines 101 in response to signals from the control circuit 105. Then, the scanning line driving circuit 104 applies one of voltages VGH and VGL from the voltage generation circuit 106 to the selected scanning line 101, and applies the other voltage VGH or VGL to the other scanning lines 101 which are not selected. In response to signals from the control circuit 105, the signal line driving circuit 107 applies the voltage VSL or VSH from the voltage generation circuit 106 to each of the signal lines 102. The voltage generation circuit 106 applies a common voltage COM to the counter electrode (not shown). In the next scanning period,. the scanning driving circuit 104 selects another one of the scanning lines 101. In this manner, the scanning lines 101 are sequentially selected and then the rest of the operation described above is performed.

Thus, the pixel electrodes 103 connected to each scanning line 101 are driven in each horizontal scanning period, and display corresponding to such pixel electrodes 103 is performed. In one frame, display corresponding to one image plane is performed.

In such an active matrix liquid crystal display device, the substrates are formed of quartz or glass. A switching element (not shown; e.g., thin film transistor) is provided in correspondence with each pixel electrode 103 for turning ON and OFF the pixel electrode 103. Recently, the scanning line driving circuit 104 and the signal line driving circuit 107 are integrated on the substrate in order to reduce the cost and the size of the liquid crystal display device.

A liquid crystal display device having the driving circuits integrated on the substrate is disclosed in, for example, SID '96 DIGEST, pp. 17–20. In the liquid crystal display device disclosed in the abovementioned publication, lines which include areas to be gate electrodes of the thin film transistors are anodized. Thus, generation of hillocks and the like is prevented even when the gate electrodes are formed of aluminum-type metal materials having a relatively low resistance; and the offset length of the thin film transistors is controlled at a satisfactorily high precision. Accordingly, the operation of the thin film transistors is stabilized.

In response to a demand for a highly integrated structure, some active matrix liquid crystal display devices adopt a connection structure, in which a plurality of conductive layers are laminated with insulative layers interposed therebetween and the conductive layers are connected to one another through an opening (contact hole) in each of the insulative layers.

FIG. 14A is a plan view of a conventional connection structure included in a semiconductor device, and FIG. 14B is a cross-sectional view of the connection structure taken along line C–C' in FIG. 14A. The connection structure shown in FIGS. 14A and 14B includes a first conductive layer 111, an interlayer insulative layer 112 and a second conductive layer 113 which are sequentially laminated. The second conductive layer 113 is connected to the first conductive layer 111 through an opening 112a formed in the interlayer insulative layer 112. The opening 112a has a smaller planar size than that of each of the first and second conductive layers 111 and 113, and the opening 112a is substantially completely covered by the second conductive layer 113.

As shown in FIG. 14A, the conventional connection structure has a connection section 114 in which the first conductive layer 111 and the second conductive layer 113 are connected to each other. The connection section 114 is set to have a larger planar size than that of the opening 112a in consideration of the precision with which the first and second conductive layers 111 and 113 can be positioned with respect to the opening 112a and also in consideration of the displacement of the layers 111, 112 and 113 caused during etching, which is performed for patterning the layers 111, 112 and 113.

According to the design rule adopted in a usual semiconductor fabrication process, where the alignment margin or design margin is λ, the minimum width of the pattern of a conductive layer is 2λ and the distance between two adjacent patterns of the conductive layer is 2λ. In the case of the display device shown in FIGS. 14A and 14B, the minimum value for width W1 of a pattern of the second conductive layer 113 (hereinafter, referred to the "second conductive layer pattern 113" for simplicity) is 2λ, and alignment margin M1 required. for each of two ends of the second conductive layer pattern 113 in the width direction is λ. The connection section 114 needs to be extended in the width direction beyond edges 113a and 113b of the second conductive layer pattern 113 so as to accommodate the two alignment margins (2λ). The distance between two adjacent second conductive layer patterns 113 (only one is shown in FIGS. 14A and 14B) in the width direction is 2λ. As a result, a width of 8λ is required to provide one second conductive layer pattern 113. In the case where a plurality of second conductive layer patterns 113 are arranged as shown in FIG.

15, the pitch of the second conductive layer patterns 113 is at least 5λ (sum of the width 2λ of each second conductive layer pattern 113, the alignment margin λ and the distance 2λ between one connection section 114 and an adjacent second conductive layer pattern 113).

In the case where the driving circuits are integrated on one substrate as described above, output stages of a driving circuit are provided in correspondence with the scanning lines and/or the signal lines. The output stages need to be arranged at the same pitch as that of the pixel electrodes, which requires an increased density of lines and other elements. Especially in the fields of high precision liquid crystal panels and liquid crystal panels to be used in conjunction with projectors, the pitch of the pixel electrodes is sometimes as small as 30 µm or less. Accordingly, the connection section 114 is demanded to have a minimum possible width.

In order to anodize the gate electrodes of the thin film transistors as described above, a DC voltage needs to be applied between the gate electrodes and the anodizing solution (a solution of tartaric acid or oxalic acid), in which the gate electrodes are immersed. In order to apply the DC voltage, the gate electrodes need to be commonly connected to an application terminal of the DC voltage and then separated from one another after the anodization.

A conventional method for producing a connection structure including anodization of gate electrodes will be described with reference to FIGS. 16A, 16B, 17A, 17B, 18A, 18B, 19, 20A and 20B.

A first conductive layer is patterned by a first patterning step as shown in FIG. 16A (plan view) and FIG. 16B (cross-sectional view), thereby forming a line pattern 123 including areas 121 and 122 to be gate electrodes. (The areas 121 and 122 to be gate electrodes will be referred to "the gate electrodes 121 and 122" for simplicity.) The gate electrodes 121 and 122 are anodized by applying a DC voltage between the gate electrodes 121 and 122 and an anodizing solution in which the gate electrodes 121 and 122 are immersed in the state where the gate electrodes 121 and 122 as included in the line pattern 123 are commonly connected to an application terminal of the DC voltage.

Next, as shown in FIG. 17A (plan view) and FIG. 17B (cross-sectional view), intermediate areas between the gate electrodes 121 and 122 are removed by a second patterning step, thereby electrically separating the gate electrodes 121 and 122 from each other.

Then, as shown in FIG. 18A (plan view) and FIG. 18B (cross-sectional view), an interlayer insulative layer 124 is formed so as to cover the gate electrodes 121 and 122, and openings 124a are formed in the interlayer insulative layer 124.

As shown in FIG. 19, a second conductive layer 125 is formed so as to cover the interlayer insulative layer 124 and the gate electrodes 121 and 122, and is patterned as shown in FIG. 20A (plan view) and FIG. 20B (cross-sectional view).

According to this method, the gate electrodes 121 and 122 are anodized and then patterned, which requires two-stage patterning. Therefore, photolithography and etching need to be performed one extra time compared to the method for producing a thin film transistor without anodization. The extra step of photolithography and etching increases the production cost and reduces the production yield. Under these circumstances, a method for producing a thin film transistor including the step of anodizing gate electrodes without requiring such an extra step has been demanded.

SUMMARY OF THE INVENTION

According to one aspect of the invention, a semiconductor device includes a first conductive layer; an interlayer insulative layer having an opening; and a second conductive layer. The first conductive layer, the interlayer insulative layer and the second conductive layer are sequentially laminated. The second conductive layer is connected to the first conductive layer through the opening. The opening is partially covered by the second conductive layer, and an area of the first conductive layer is substantially entirely covered by the second conductive layer in the opening.

In one embodiment of the invention, a connection section in which an area of the first conductive layer and an area of the second conductive layer which are connected to each other ha s a smaller planar size than a planar size of the opening.

In one embodiment of the invention, the second conductive layer covers at least a part of a periphery of the opening.

In one embodiment of the invention, the first conductive layer and the second conductive layer are formed of a metal material In one embodiment of the invention, the first conductive layer has an anodized layer on at least a part of a side surface thereof.

According to another aspect of the invention, a method for producing a semiconductor device includes the steps of forming a first conductive layer; forming an interlayer insulative layer on the first conductive layer and forming an opening in the interlayer insulative layer; forming a second conductive layer on the first conductive layer so as to cover the interlayer insulative layer; and patterning the second conductive layer. The step of patterning the second conductive layer also patterns an area of the first conductive layer located in the opening.

In one embodiment of the invention, the step of patterning the second conductive layer patterns the second conductive layer so as to partially cover the opening.

In one embodiment of the invention, the step of patterning the second conductive layer electrically divides the first conductive layer into at least two at the opening.

In one embodiment of the invention, the step of forming the first conductive layer includes the steps of patterning the first conductive layer and anodizing the first conductive layer, and the step of patterning the second conductive layer also patterns the first conductive layer having an anodized layer on a surface thereof.

In one embodiment of the invention, the step of patterning the second conductive layer is performed by dry etching.

According to still another aspect of the invention, a display device has a connection structure. The connection structure includes a first conductive layer; an interlayer insulative layer having an opening; and a second conductive layer. The first conductive layer, the interlayer insulative layer and the second conductive layer are sequentially laminated. The second conductive layer is connected to the first conductive layer through the opening. The opening is partially covered by the second conductive layer, and an area of the first conductive layer is substantially entirely covered by the second conductive layer in the opening.

In one embodiment of the invention, a display device includes a first substrate including a plurality of scanning lines, a plurality of signal lines, a plurality of pixel electrodes respectively provided at intersections of the scanning lines and the signal lines, and a plurality of switching elements respectively for connecting the pixel electrodes to the scanning lines and the signal lines; a second substrate including a counter electrode; a liquid crystal layer interposed between the first substrate and the second substrate; and a driving circuit for supplying a voltage to the plurality of pixel electrodes and the counter electrode to drive the liquid crystal layer. The plurality of scanning lines are formed of the first conductive layer and have an anodized layer on-at least a part of a side surface thereof.

In one embodiment of the invention, the driving circuit is provided on the first substrate and includes the connection structure.

Thus, the invention described herein makes possible the advantages of (1) providing a semiconductor device including a connection structure having a connection section which has a reduced planar size, a method for producing the same, and a display device including such a connection structure; and (2) a semiconductor device which includes a connection structure and is produced by a simplified method even when one of two conductive layers is anodized, and such a simplified method.

These and other advantages of the present invention will become apparent to those skilled in the art upon reading and understanding the following detailed description with reference to the accompanying figures.

BRIEF DESCRIPTION OF THE DRAWINGS

FIG. 15 is a plan view of a connection structure including a plurality of connection sections.

DESCRIPTION OF THE PREFERRED EMBODIMENTS

Hereinafter, the present invention will be described by way of illustrative examples with reference to the accompanying drawings.

EXAMPLE 1

Figure 1A:
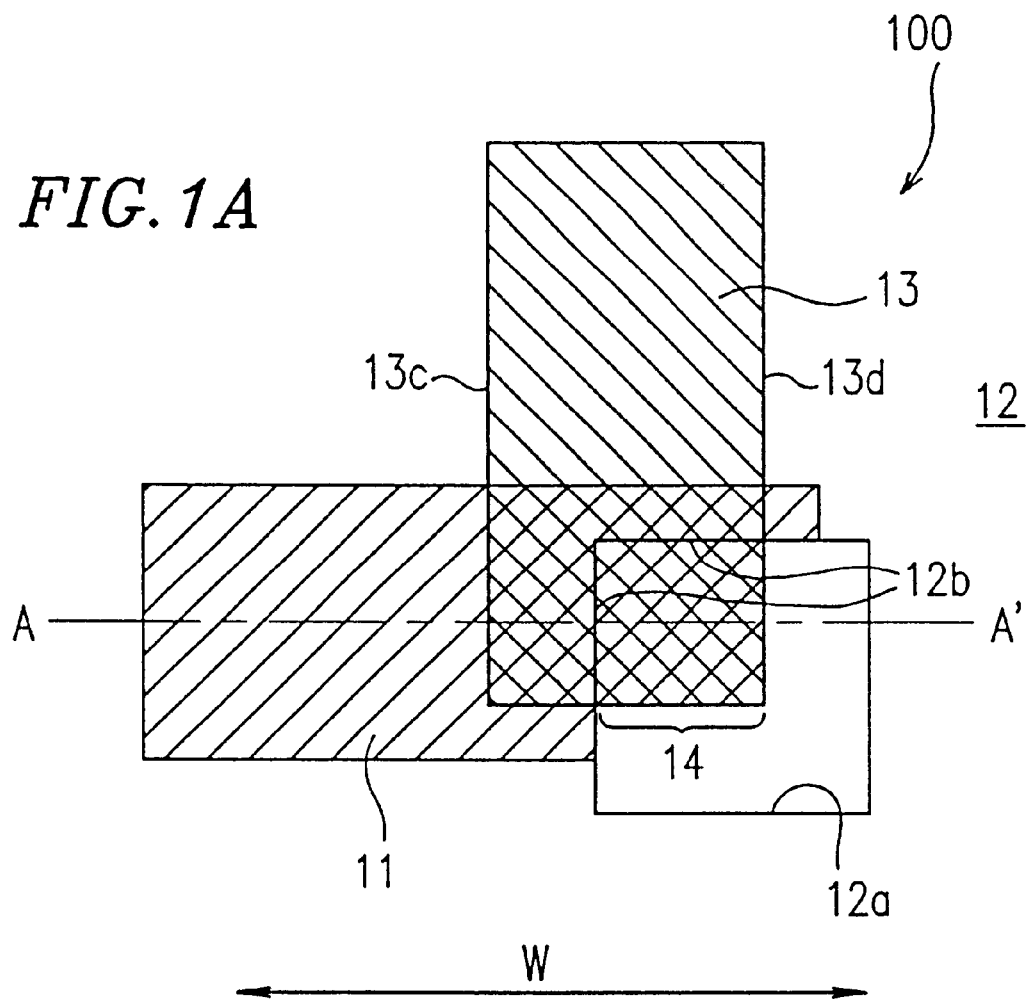
FIG. 1A is a plan view of a connection structure included in a semiconductor device in a first example according to the present invention.
Figure 1B:
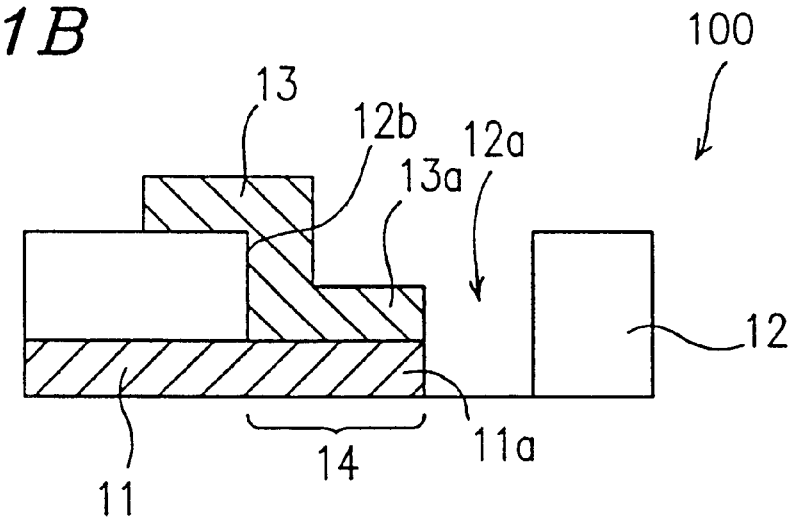
FIG. 1B is a cross-sectional view of the connection structure taken along line A–A' in FIG. 1A.

FIG. 1A is a plan view of a connection structure 100 included in a semiconductor device in a first example according to the present invention, and FIG. 1B is a cross-sectional view of the connection structure 100 taken along line A–A'.

As shown in FIGS. 1A and 1B, the connection structure 100 includes a first conductive layer 11, an interlayer insulative layer 12, and a second conductive layer 13 which are sequentially laminated. The first conductive layer 11 is connected to the second conductive layer 13 through an opening 12a formed in the interlayer insulative layer 12.

The connection structure 100 includes a connection section 14 which includes an area 11a of the first conductive layer 11 located in the opening 12a and an area 13a of the second conductive layer 13 located in the opening 12a. The area 11a of the first conductive layer 11 and the area 13a of the second conductive layer 13 have an identical planar shape with each other and are connected to each other.

Figure 14A:
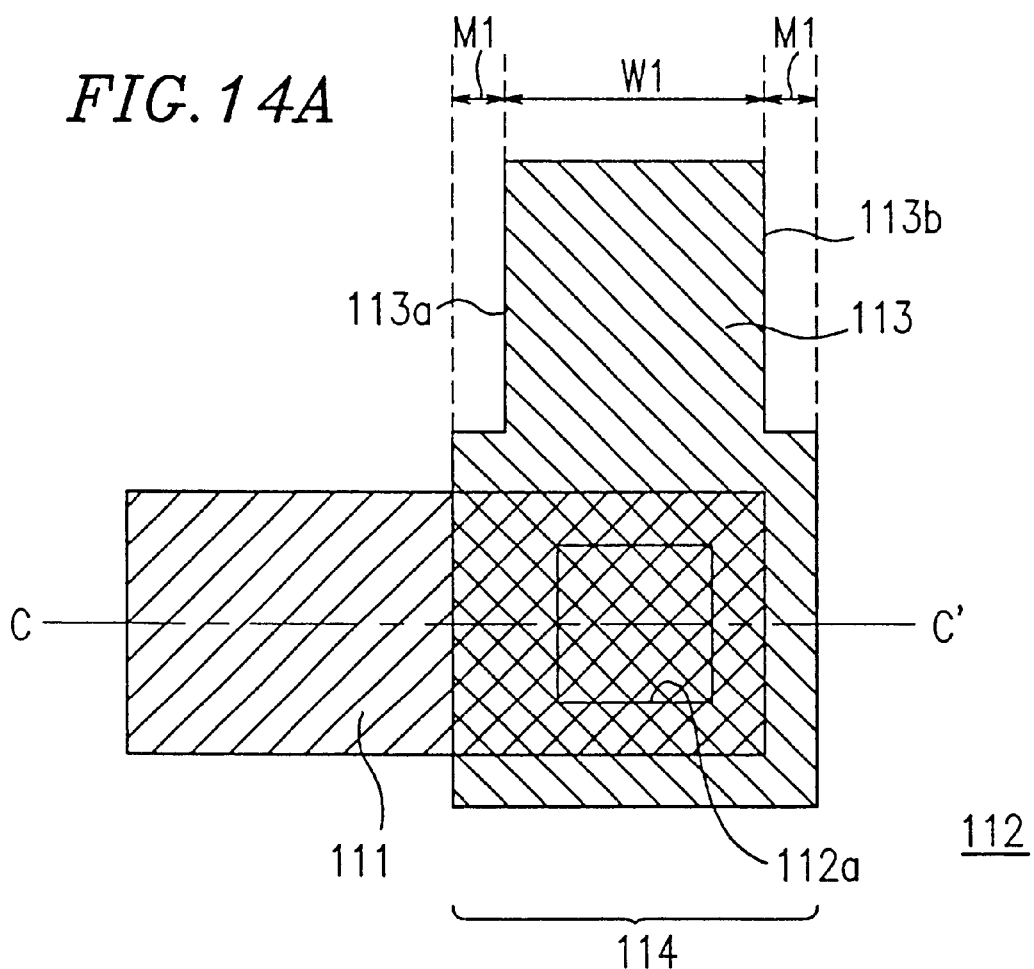
FIG. 14A is a plan view of a connection structure of the conventional liquid crystal display device.
Figure 14B:
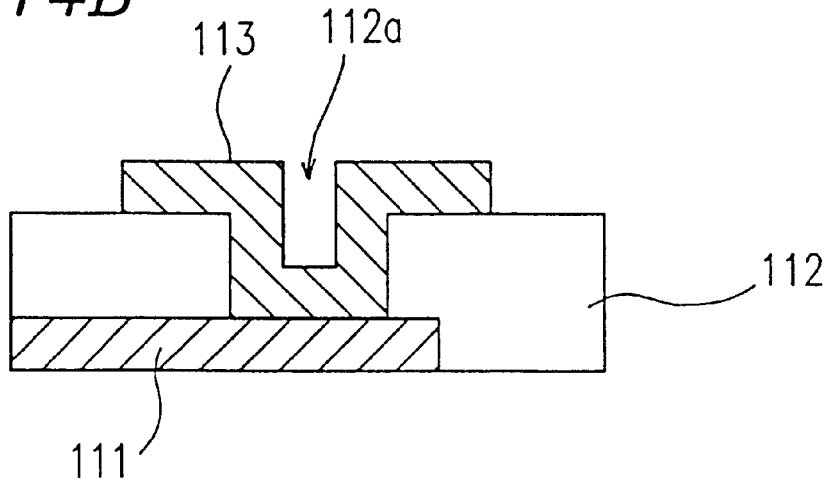
FIG. 14B is a cross-sectional view of the connection structure taken along line C–C' in FIG. 14A.
Figure 16A:
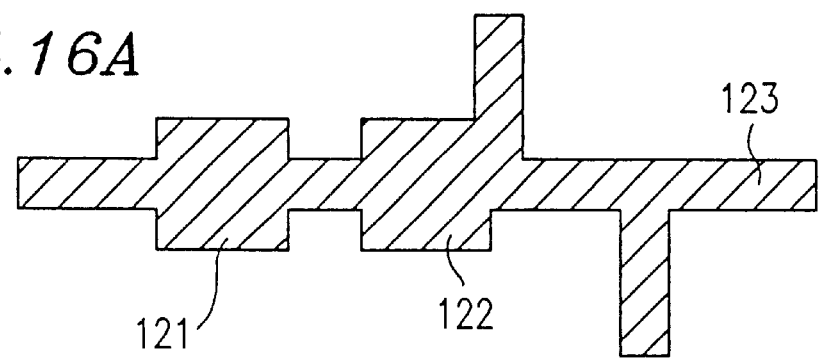
FIGS. 16A, 16B, 17A, 17B, 18A, 18B, 19, 20A and 20B are views illustrating a conventional method for producing a connection structure.
Figure 16B:
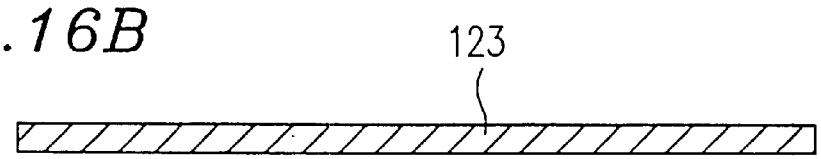
Figure 17A:
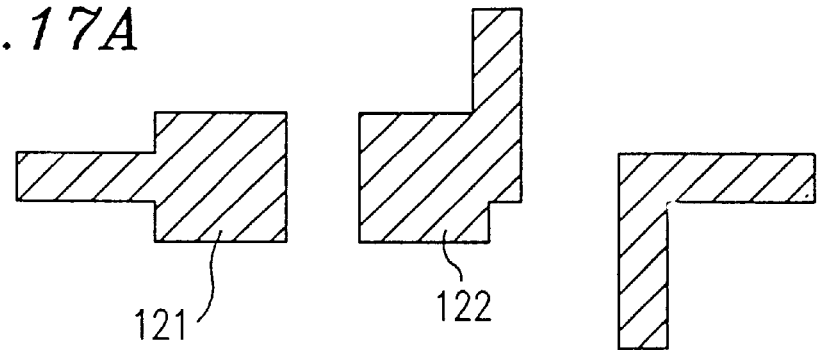
Figure 17B:
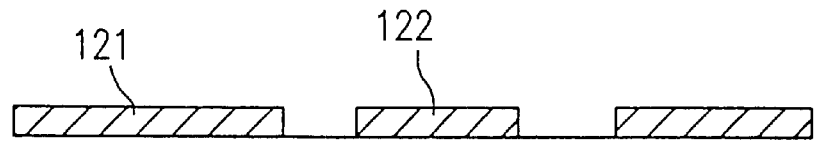
Figure 18A:
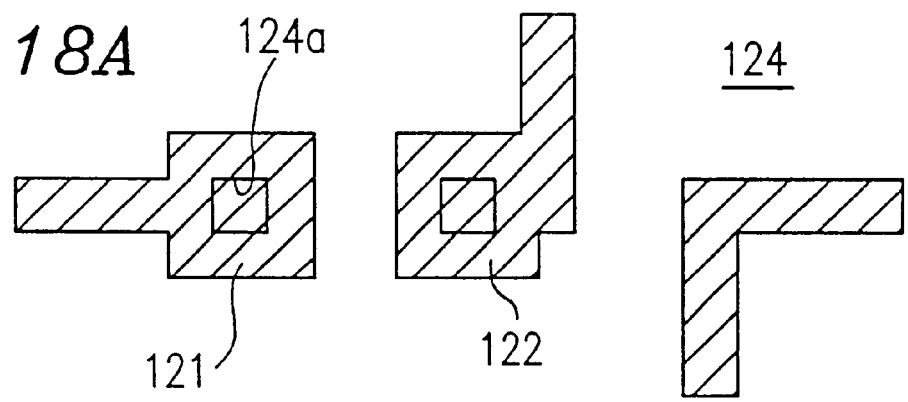
Figure 18B:
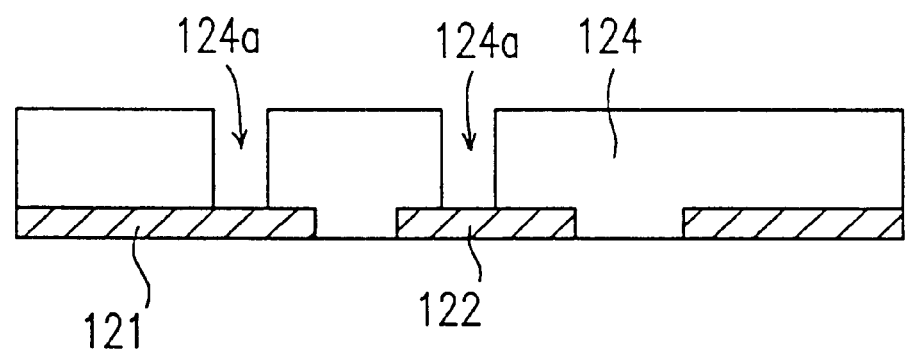
Figure 19:
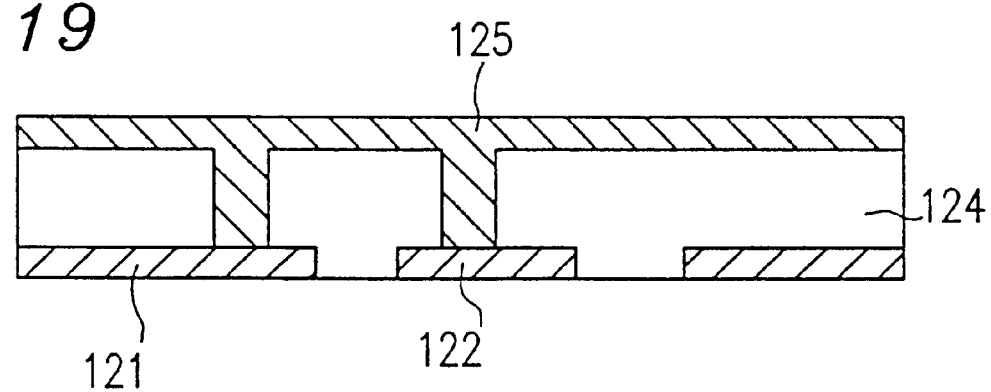
Figure 20A:
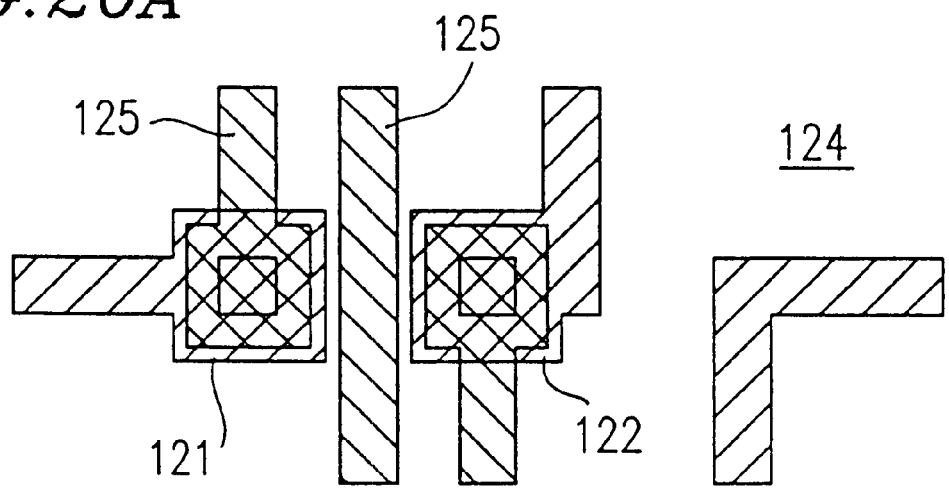
Figure 20B:
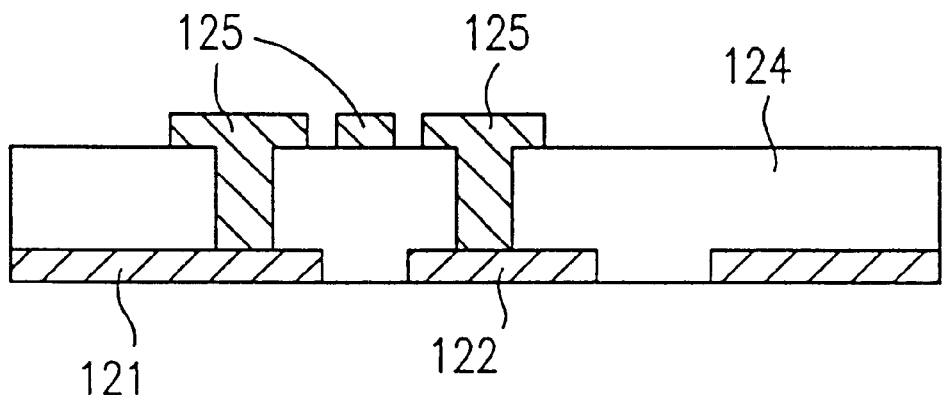

Since the opening 12a has a planar size which is sufficiently larger than that of the connection section 14, the connection section 14 needs to have neither a margin for positioning the first conductive layer 11 with respect to the opening 12a nor a margin-for positioning the second conductive layer 13 with respect to the opening 12a. Accordingly, the connection section 14 does not need to be extended in two directions as shown by arrow W beyond edges 13c and 13d of the second conductive layer 13 so as to accommodate the margins, unlike the connection section 114 shown in FIGS. 14A and 14B. The connection section 14 is reduced in size by the margins.

The opening 12a is sufficiently large to reduce the possible insufficient opening and thus to significantly reduce the defective connection between the first conductive layer 11 and the second conductive layer 13.

Since an edge 12b of the opening 12a is covered by the second conductive layer 13, an area of the first conductive layer 11 outside the opening 12a and the area 11a of the first conductive layer 11 in the opening 12a are continuously covered by the second conductive layer 13. Due to such a structure, the area 11a of the first conductive layer 11 is prevented from being separated from the rest of the layer 11 and completely isolated by the patterning of the second conductive layer 13.

The first conductive layer 11 and the second conductive layer 13 are formed of an identical material such as, for example, aluminum or an alloy of aluminum with silicon or scandium. Since the first and second conductive layers 11 and 13 are formed of an identical material, the area 11a of the first conductive layer 11 in the opening 12a is patterned by the patterning of the second conductive layer 13. Accordingly, the area 13a of the second conductive layer 13 in the opening 12a and the area 11a of the first conductive layer 11 in the opening 12a obtain an identical planar shape.

Figure 2A:
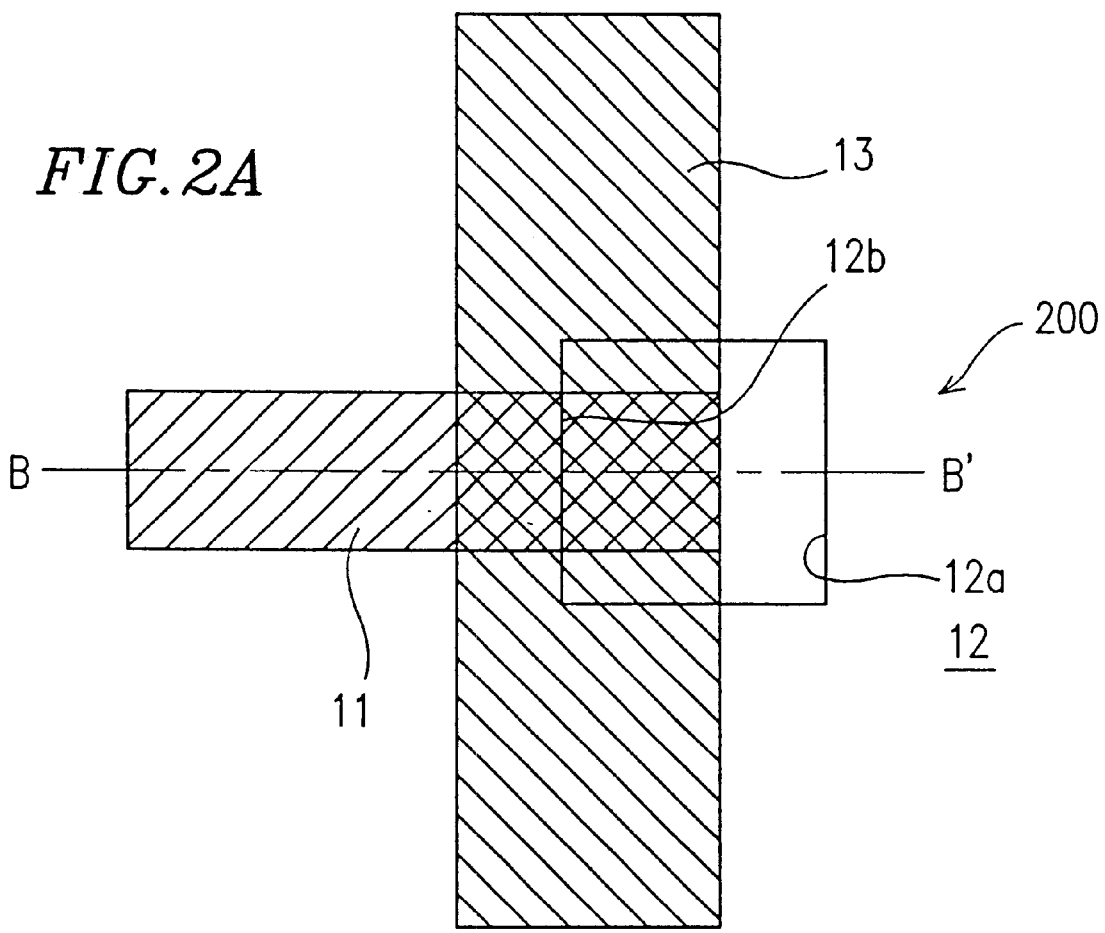
FIG. 2A is a plan view of a connection structure included in a semiconductor device in another example according to the present invention.
Figure 2B:
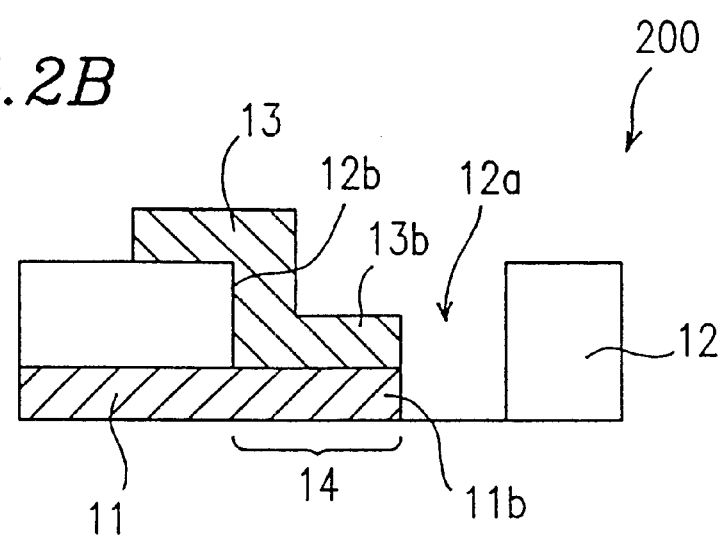
FIG. 2B is a cross-sectional view of the connection structure taken along line B–B' in FIG. 2A.

FIG. 2A is a plan view of a connection structure 200 included in a semiconductor device in another example according to the present invention. FIG. 2B is a cross-sectional view of the connection structure 200 taken along line B–B' in FIG. 2A.

Although an area 11b of the first conductive layer 11 in the opening 12a and an area 13b of the second conductive layer 13 in the opening 12a have different planar shapes from each other, the area 11b is completely covered by the area 13b in the opening 12a.

In the above-described two examples, the first conductive layer 11 is substantially entirely covered by the second conductive layer 12 in the opening 12a.

EXAMPLE 2

Figure 3:
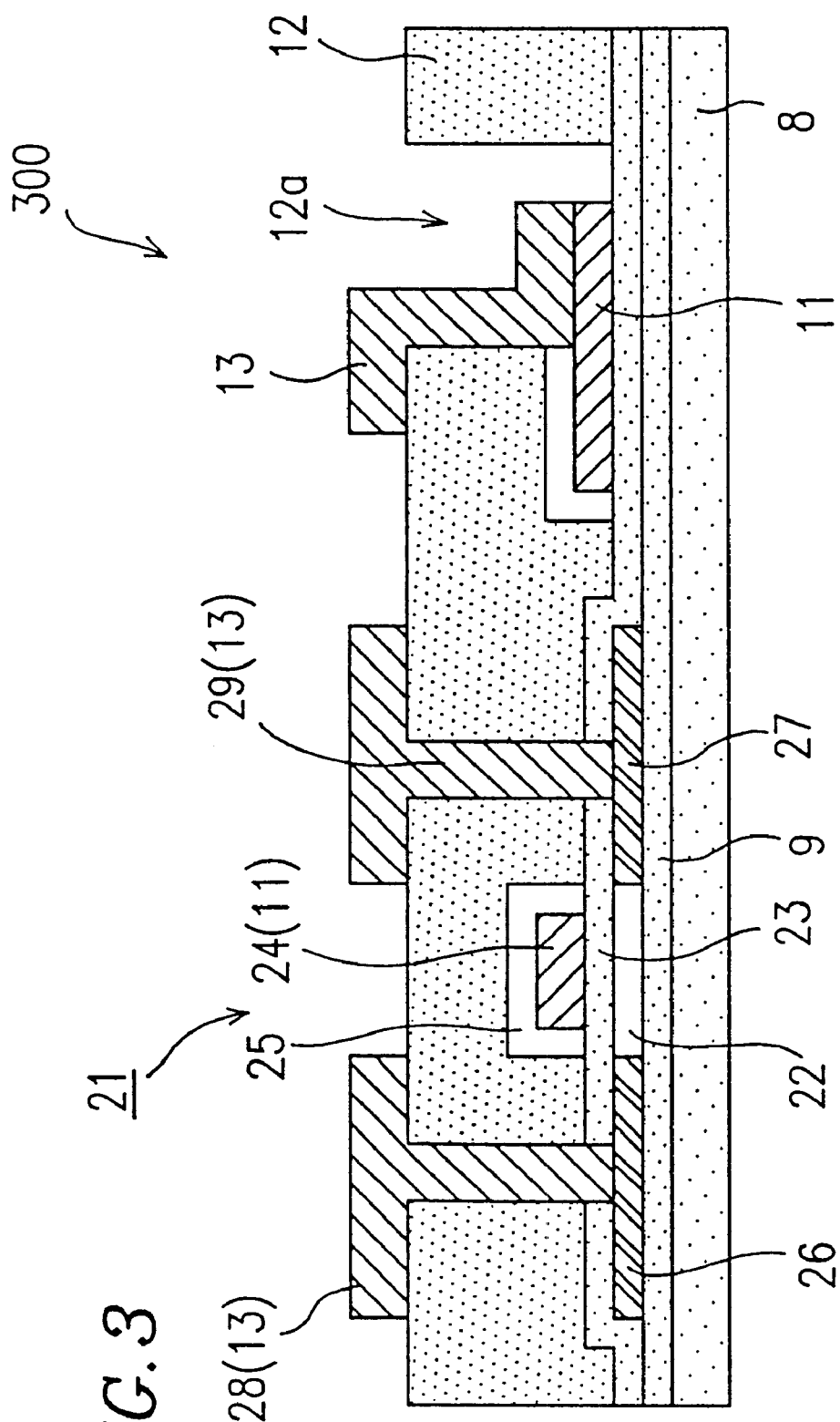
FIG. 3 is a cross-sectional view of a semiconductor device in a second example according to the present invention.

FIG. 3 is a cross-sectional view of a semiconductor device. 300 in a second example according to the present invention, which includes the connection structure 100 or 200 shown in FIGS. 1A and 1B or FIGS. 2A and 2B.

The semiconductor device 300 includes a polysilicon thin film transistor 21. The polysilicon thin film transistor 21 includes a semiconductor layer 22 provided above a substrate 8 with an insulative layer 9 interposed therebetween, a gate electrode 24 provided on the semiconductor layer 22 with a gate insulative layer 23 interposed therebetween, an anodized layer 25 provided on at least a side surface of the gate electrode 24, a source region 26 and a drain region 27 provided in the semiconductor layer 22 as a result of impurity implantation, an electrode 28 connected to the source region 26, and an electrode 29 connected to the drain region 27. The gate electrode 24 may be formed of the first conductive layer 11. The electrodes 28 and 29 may be formed of the second conductive layer 13.

Since the impurities are implanted into the semiconductor layer 22 to form the source region 26 and the drain region 27 after the anodized layer 25 is formed on the gate electrode 24, offset regions for the source region 26 and the drain region 27 are formed. Accordingly, the off-state characteristics of the thin film transistor 21 (e.g., reduction in the leak current) and the source-drain withstand voltage are improved.

In order to provide the thin film transistor 21 having the above-described structure, a first patterning of the first conductive layer 11 including the gate electrode 24 is performed. A plurality of gate electrodes can be anodized in the same step, although only one gate electrode is shown in FIG. 3. Then, a voltage is applied to the first conductive layer 11 in a solution of tartaric acid or oxalic acid, thereby anodizing. at least a side surface of the pattern obtained by the first patterning. After the anodization, a second patterning of the first conductive layer 11 is performed, thereby obtaining a desirable pattern from the first conductive layer 11.

In order to simplify a method for producing the semiconductor device 300, the second patterning is performed so as to pattern the first conductive layer 11 and also the second conductive layer 13, as described in a fourth example below. Thus, the second patterning forms a desirable pattern of the second conductive layer 13 and also separates the gate electrode 24 from the rest of the first conductive layer 11.

EXAMPLE 3

In a third example according to the present invention, a method for producing the connection structure 100 or 200 shown in FIGS. 1A and 1B or FIGS. 2A and 2B included in a semiconductor device will be described with reference to FIGS. 4A through 4F.

Figure 4A:
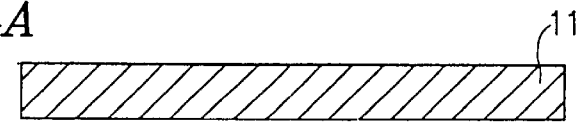
FIGS. 4A through 4F are cross-sectional views illustrating a method for producing a connection structure according to the present invention.
Figure 4B:

The first conductive layer 11 is formed on a substrate (not shown) as shown in FIG. 4A, and patterned as shown in FIG. 4B.

Figure 4C:
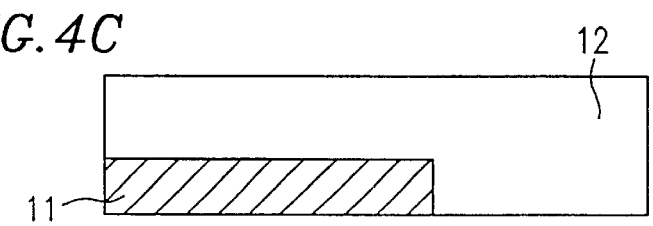
Figure 4D:
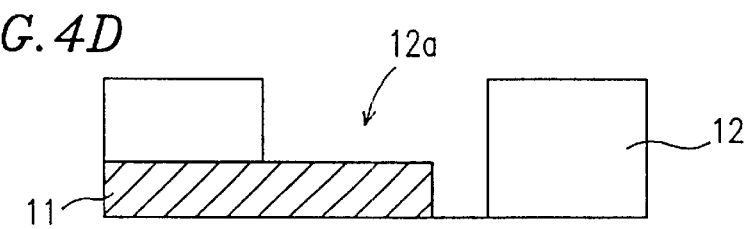

The interlayer insulative layer 12 is formed so as to cover the patterned first conductive layer 11 in the openings 12a as shown in FIG. 4C, and patterned as shown in FIG. 4D, thereby forming the opening 12a.

Figure 4E:
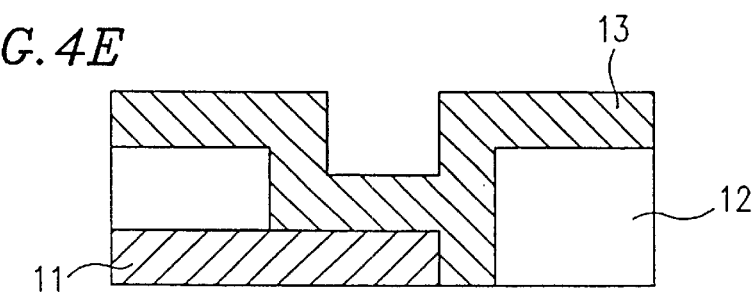
Figure 4F:
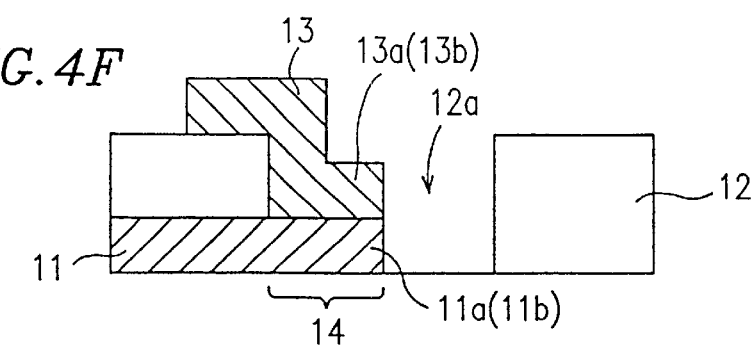

The second conductive layer 13 is formed so as to cover the patterned first conductive layer 11 and the interlayer insulative layer 12 as shown in FIG. 4E. The second conductive layer 13 is patterned as shown in FIG. 4F. By the step of patterning the second conductive layer 13, the area 11a (or 11b) of the first conductive layer 11 in the opening 12a is also patterned. Thus, the area 11a (or 11b) of the first conductive layer 11 in the opening 12a and the area 13a (or 13b) of the second conductive layer 13 in the opening 12a together form the connection section 14.

As can be appreciated from the above-described production method of the connection structure 100 or 200, the connection section 14 includes only the area 11a (or 11b) of the first conductive layer 11 and the area 13a (or 13b) of the second conductive layer 13 which overlap each other. Furthermore, the opening 12a is sufficiently larger than the connection section 14. Accordingly, the connection section 14 needs to have neither a margin for positioning the first conductive layer 11 with respect to the opening 12a nor a margin for positioning the second conductive layer 13 with respect to the opening 12a. Thus, the connection section 14 is reduced in size.

EXAMPLE 4

Figure 5A:
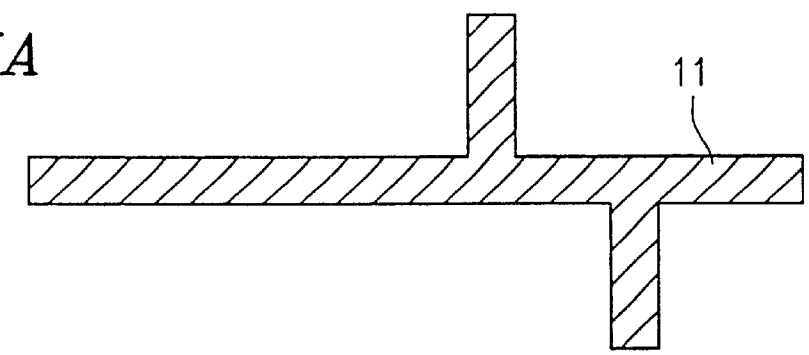
FIGS. 5A, 5B, 6A, 6B, 7, 8A and 8B are views illustrating a method for producing a semiconductor device according to the present invention.

In a fourth example according to the present invention, a method for producing-a semiconductor device will be described with reference to FIGS. 5A, 5B, 6A, 6B, 7, 8A and 8B. FIGS. 5A, 6A and 8A are plan views, and FIGS. 5B, 6B and 8B are cross-sectional views.

Figure 5B:
Figure 6A:
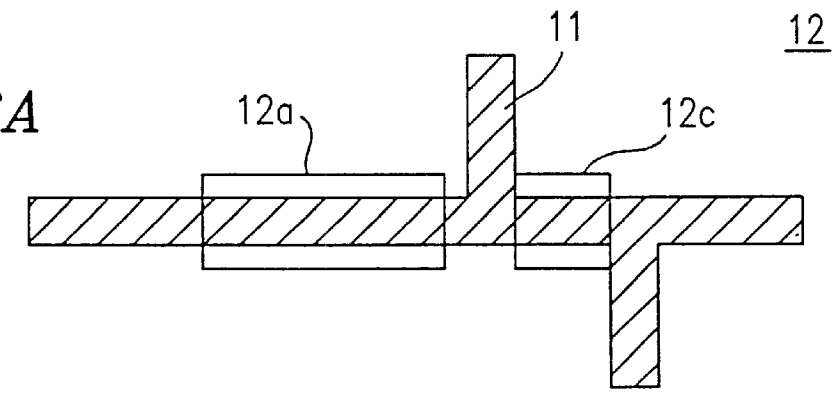

As shown in FIGS. 5A and 5B, the first conductive layer 11 is formed on a substrate (not shown) and patterned into a continuous shape without any disconnection. The first conductive layer 11 may include an area to be the gate electrode 24 (FIG. 3). (The area to be the gate electrode 24 will be referred to as the "gate electrode 24" for simplicity.)

The first conductive layer 11 is immersed in an anodizing solution (e.g., a solution of tartaric acid or oxalic acid) and then a DC voltage is applied between the first conductive layer 11 and the anodizing solution, thereby anodizing the surface of the first conductive layer 11. This process also anodizes a surface of the gate electrode 24 in the case where the gate electrode 24 is included in the first conductive layer 11.

Figure 6B:
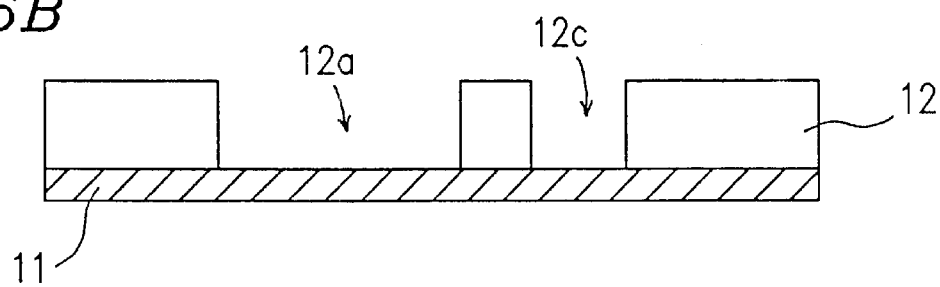

Next, as shown in FIGS. 6A and 6B, the interlayer insulative layer 12 is formed on the patterned first conductive layer 11 and patterned, thereby forming openings 12a and 12c.

Figure 7:
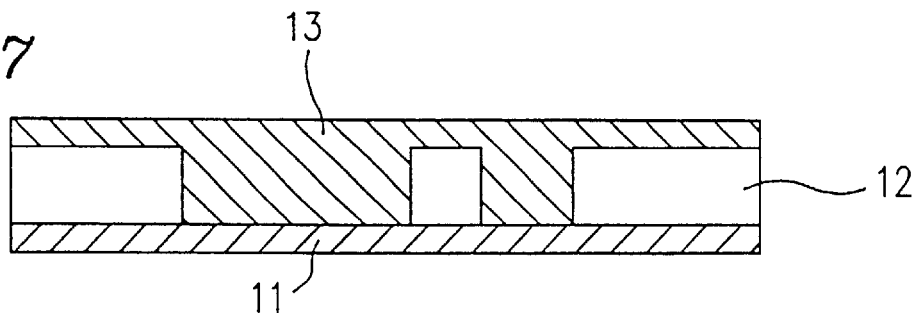
Figure 8A:
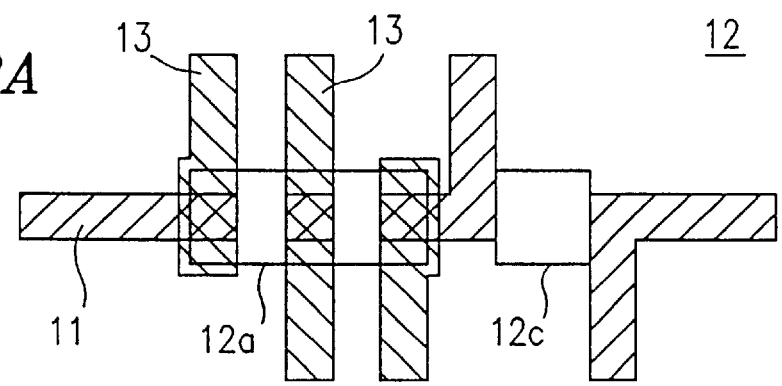
Figure 8B:
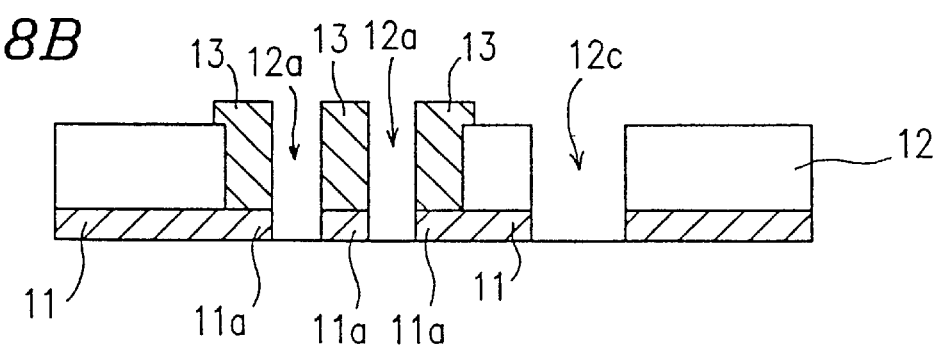

As shown in FIG. 7, the second conductive layer 13 is formed so as to cover the patterned first conductive layer 11 and the interlayer insulative layer 12. As shown in FIGS. 8A and 8B, the second conductive layer 13 is patterned. By the step of patterning the second conductive layer 13, the area 11a (or 11b) of the first conductive layer 11 in the opening 12a, and an area of the first conductive layer 11 in the opening 12c, are patterned. The gate electrode 24 and other electrodes and lines are also appropriately shaped by performing patterning in other openings formed in the interlayer insulative layer 12. In this manner, the first conductive layer 11 is divided into a plurality of portions.

As can be appreciated from the above-described method for producing the semiconductor device, the first conductive layer 11 is patterned by the first patterning as shown in FIGS.

5A and 5B, and is patterned by the second patterning as shown in FIGS. 8A and 8B. Since the second patterning is also performed for the second conductive layer 13, the patterning of only the first conductive layer 11 is not performed twice. When compared to the conventional method shown in FIGS. 16A through 20B, the number of patterning is reduced by one, thus shortening the production process. Moreover, the second patterning divides the first conductive layer 11 into a plurality of portions. In this manner, the first conductive layer 11 is patterned in various manners.

In the case where the method in the fourth example is applied to production of a thin film transistor including anodization of the gate electrode, generation of hillocks of the lines is suppressed and the thin film transistor is allowed to have an offset structure.

In the case where the first and second conductive layers 11 and 13 are formed of different materials or where either one of the first or second conductive layer 11 or 13 has a multiple layer structure, dry etching is adopted in the step shown in FIGS. 8A and 8B. The reason is that dry etching allows for anisotropic etching, whereas the rate of wet etching often differs in accordance with the material of the conductive layer and thus generates inconveniences that, for example, the resultant lamination has an inwardly inclining etching surface such that an upper surface has a larger planar area than that of a bottom surface of each layer.

EXAMPLE 5

In a fifth example according to the present invention, a liquid crystal display device 400 including the connection structure 100 (FIGS. 1A and 1B) or 200 (FIGS. 2A and 2B) will be described.

Figure 9:
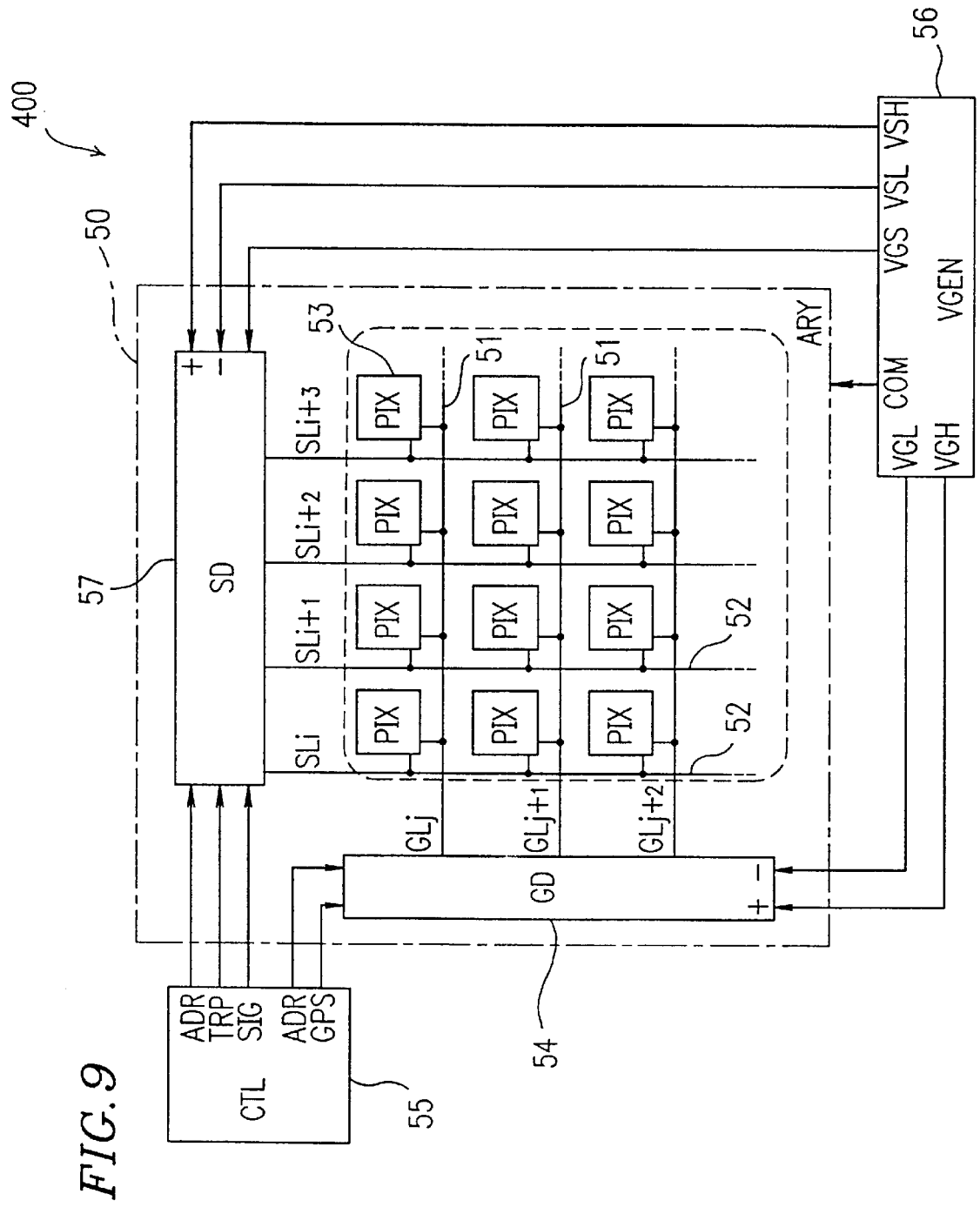
FIG. 9 is a block diagram illustrating a liquid crystal display device according to the present invention.

FIG. 9 is a block diagram illustrating a structure of the liquid crystal display device 400 of an active matrix type. A decoder circuit is used for each of a scanning line driving circuit 54 and a signal line driving circuit 57. As a liquid crystal driving system, a digital driving system using a multiplexer circuit is adopted.

Needless to say, the present invention is applicable to other types of circuits and other types of driving systems.

The active matrix liquid crystal display device 400 includes two substrates located opposed to each other and a liquid crystal layer (not shown) interposed therebetween. One of the substrates (represented by chain line 50) includes a plurality of scanning lines 51 and a plurality of signal lines 52 which are arranged perpendicular to each other. A pixel electrode 53 is provided at each of intersections of the scanning lines 51 and the signal lines 52. Although not shown, the other substrate includes a counter electrode located opposed to the pixel electrodes 53. The pixel electrodes 53 arranged along each scanning line 51 are commonly connected to the scanning line 51 via the corresponding switching elements (not shown), and the pixel electrodes 53 arranged along each signal line 52 are commonly connected to the signal line 52 via the corresponding switching elements (not shown).

The liquid crystal display device 400 shown in FIG. 9 further includes the scanning line driving circuit 54, a control circuit 55, a voltage generation circuit 56, and the signal line driving circuit 57.

In one horizontal scanning period, the scanning line driving circuit 54 selects one of the scanning lines 51 in response to an address signal ADR and a gate signal control signal GPS from the control circuit 55. Then, the scanning line driving circuit 54 applies one of voltages VGH and VGL from the voltage generation circuit 56 to the selected scanning line 51, and applies the other voltage VGH or VGL to the other scanning lines 51 which are not selected. The signal line driving circuit 57 selectively applies one of voltages VGS, VSL and VSH to each of the signal lines 52 in response to an address signal ADR, a transfer signal TRP, and a video signal SIG from the control circuit 55. The voltage generation circuit 56 applies a common voltage COM to the counter electrode. In the next scanning period, the scanning driving circuit 54 selects another one of the scanning lines 51. In this manner, the scanning lines 51 are sequentially selected and then the rest of the operation described above is performed.

Figure 10:
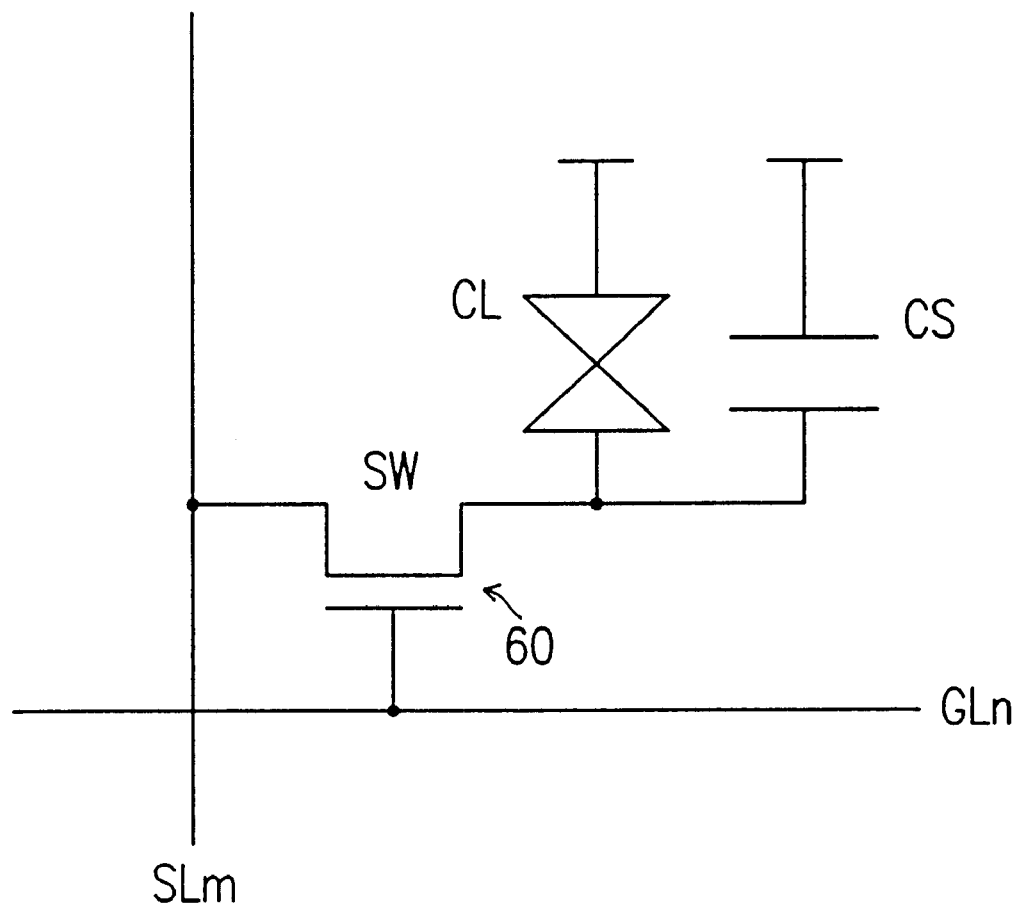
FIG. 10. is an equivalent circuit diagram illustrating a pixel in the liquid crystal display device shown in FIG. 9.

As shown in FIG. 10, the liquid crystal display device 400 includes a switching element (e.g., transistor 60) provided for connecting each pixel electrode 53 to the corresponding scanning line 51 and signal line 52. Each pixel has a pixel capacitance (sum of a liquid crystal capacitance CL and a storage capacitance CS). The polysilicon thin film transistor 21 in FIG. 3 is usable as the transistor 60. Use of the polysilicon thin film transistor 21 simplifies the method for producing the liquid crystal display device 400 due to the simplicity of the method for producing the polysilicon thin film transistor 21.

In this example, the scanning line driving circuit 54 and the signal line driving circuit 57 are integrated on the substrate 50. Output stages of the scanning line driving circuit 54 need to be provided at an equal pitch to that of the scanning lines 51, and output stages of the signal line driving circuit 57 also need to be provided at an equal pitch to that of the signal lines 52.

The semiconductor devices shown in FIGS. 1A and 1B and FIGS. 2A and 2B may be used for each output stage of the scanning line driving circuit 54 and the signal line driving circuit 57. In such a case, the line pattern of each output stage is highly precise and the output stages are allowed to be provided at the same pitch as that of the scanning lines and/or the signal lines.

Figure 11:
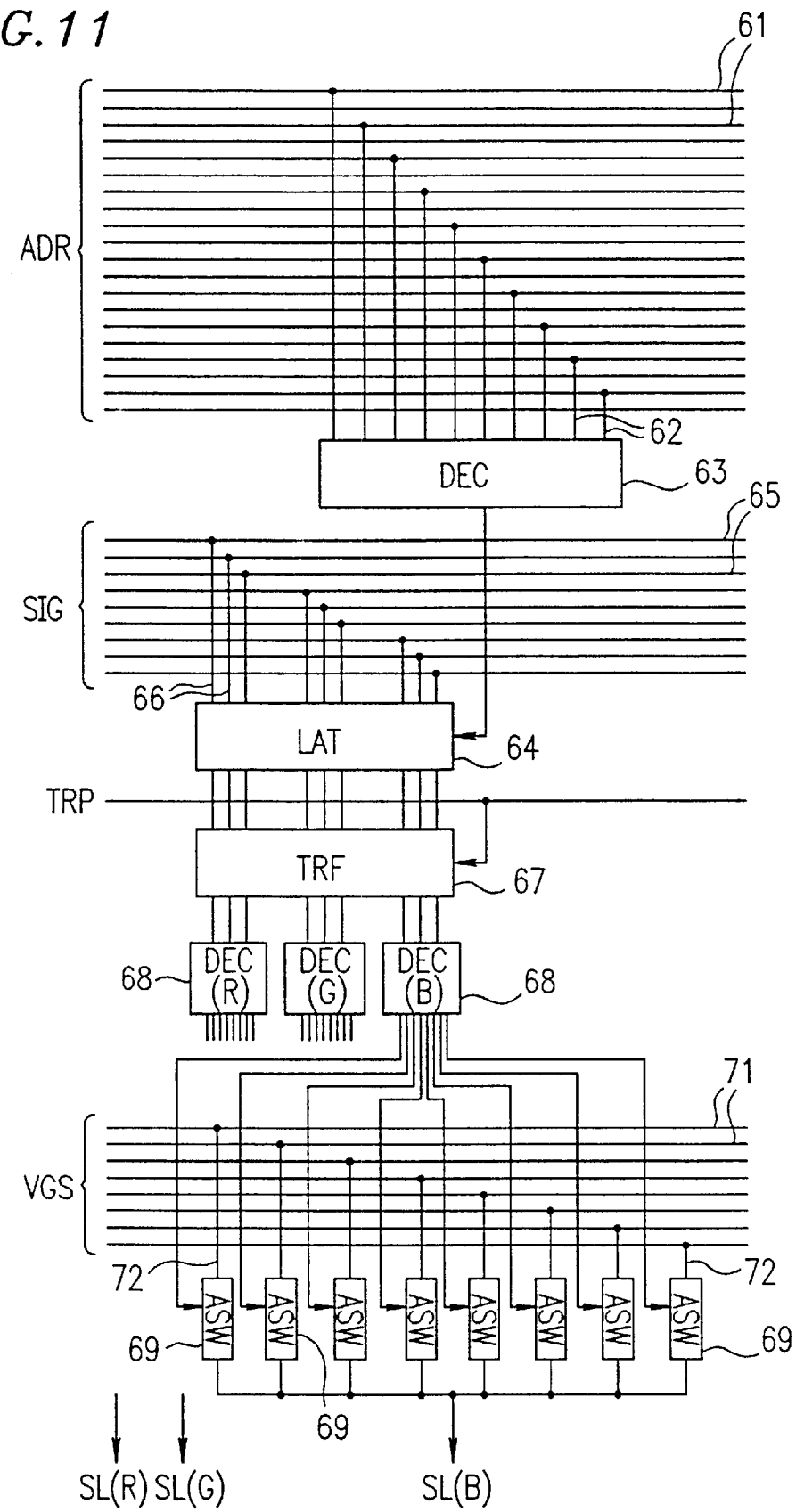
FIG. 11 is a circuit diagram illustrating an output stage of a signal line driving circuit in the liquid crystal display device shown in FIG. 9.

An exemplary structure of the output stage of the signal line driving circuit 57 is shown in FIG. 11. Such an output stage is provided for each signal line 52. In this example, an address signal ADR is input to a decoder circuit 63 through each of a plurality of address signal lines 61 and each of a plurality of signal lines 62. The address signal ADR is decoded by the decoder circuit 63, and the output from the decoder circuit 63 is sent to a latch circuit 64 as a sampling signal. In response to the sampling signal, the latch circuit 64 latches a video signal SIG of each of three primary colors through each of a plurality of video signal lines 65 and each of a plurality of signal lines 66. The video signal SIG is output to a transfer circuit 67. The transfer circuit 67 outputs the video signal SIG to one of three decoder circuits 68 corresponding to the color in response to a transfer signal TRP. A plurality of analog switches 69 are provided in correspondence to each of the decoder circuits 68. Each decoder circuit 68 selects one of the analog switches 69 in accordance with the video signal SIG and turns ON the selected analog switch 69. The analog switches 69 receive different voltages VGS through voltage signal lines 71 and signal lines 72, respectively. One signal VGS is output to one signal line 52 through each analog switch 69 which is in an ON state.

As can be appreciated from FIG. 11, the address signal lines 61 are respectively connected to the signal lines 62, and the video signal lines 65 are respectively connected to signal lines 66. The voltage signal lines 71 are respectively connected to the signal lines 72. Connection sections of the address signal lines 61 and the signal lines 62, connection sections of the video signal lines 65 and the signal lines 66, and connection sections of the voltage signal lines 71 and the signal lines 72 all need to be provided within the pitch of the signal lines 52.

Figure 12:
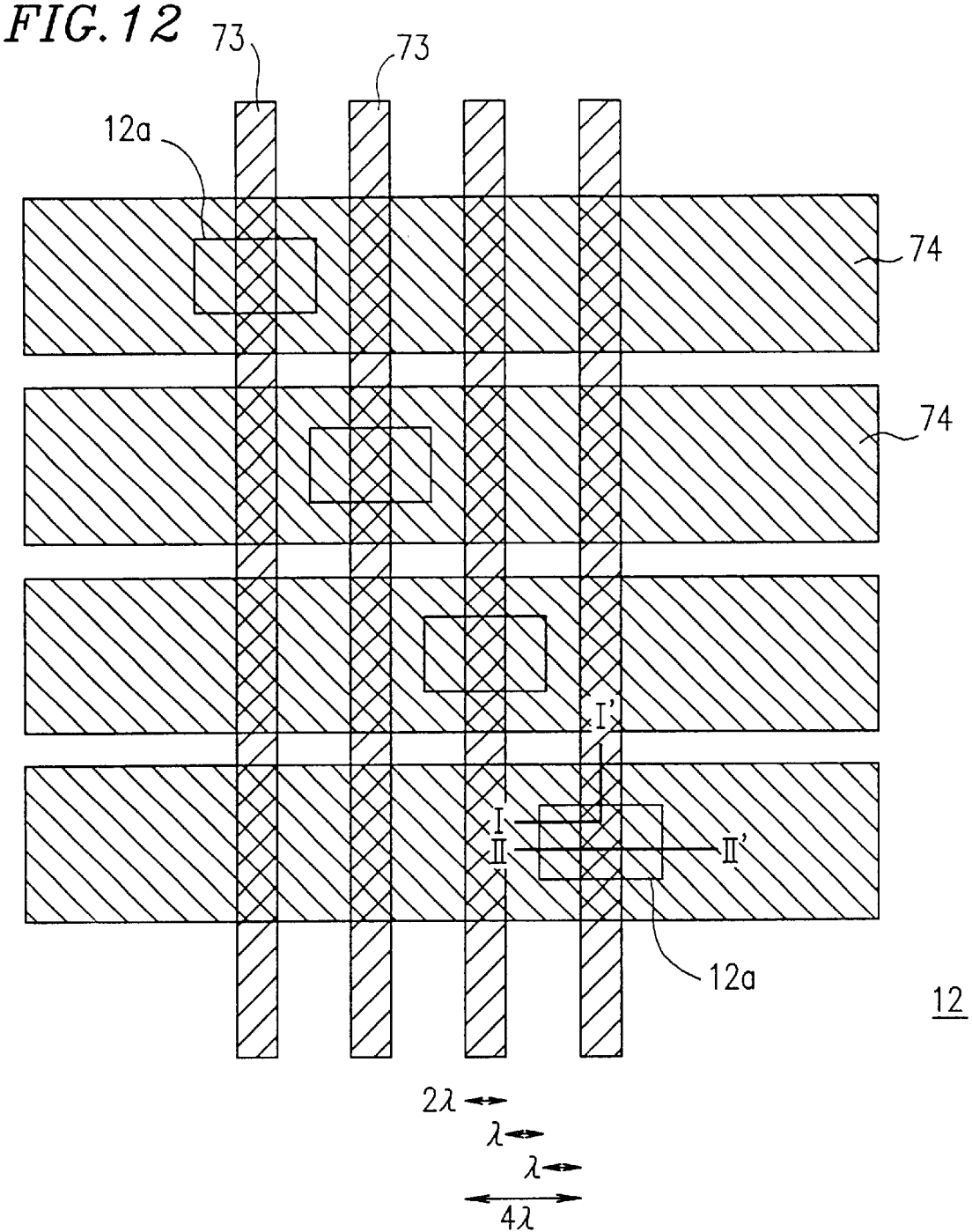
FIG. 12 is a plan view illustrating a partial line pattern of the signal line driving circuit in the liquid crystal display device shown in FIG. 9.
Figure 13:
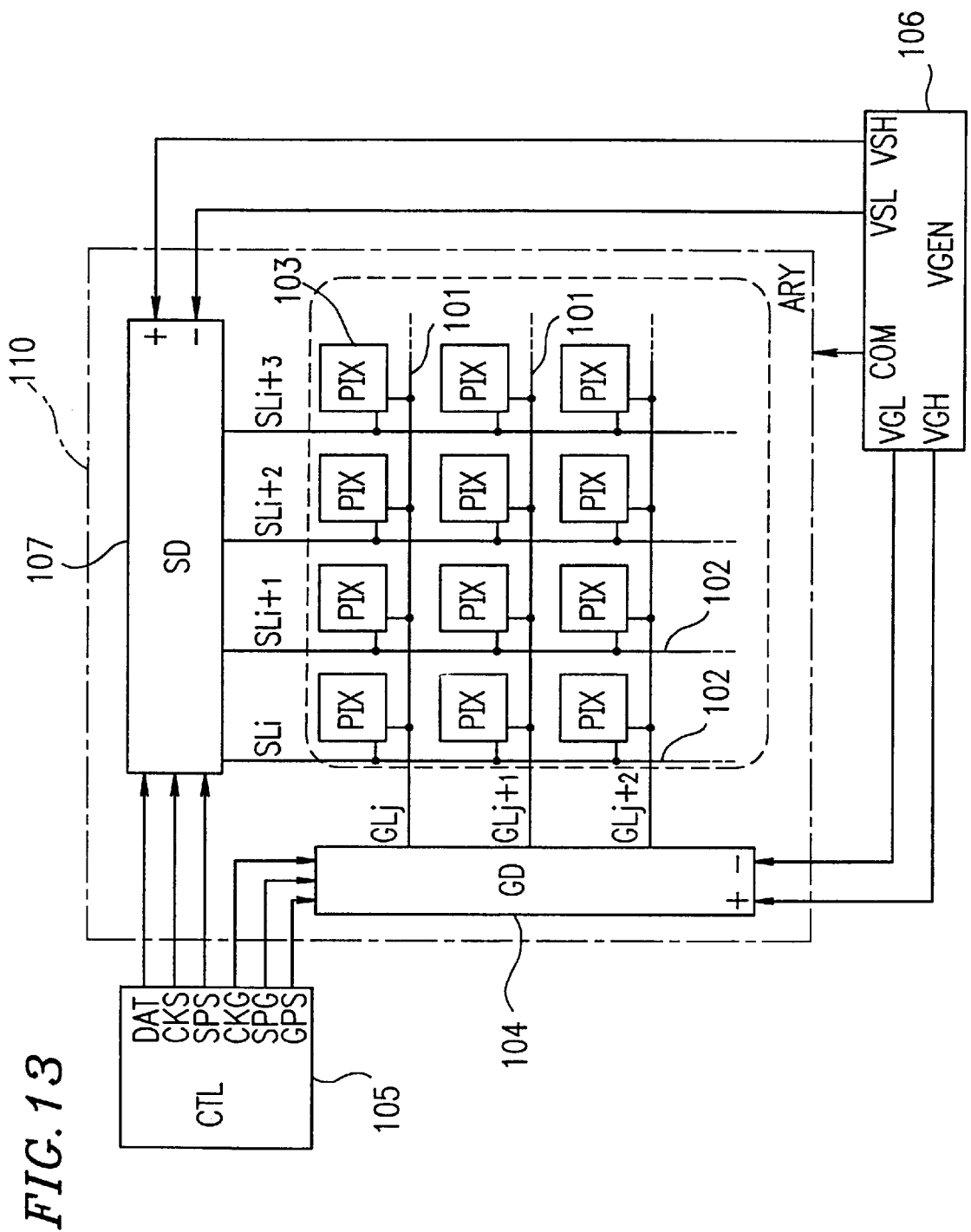
FIG. 13 is a block diagram illustrating a conventional liquid crystal display device.

FIG. 12 shows a plan view of a line pattern in which the connection structure 100 or 200 shown in FIGS. 1A and 1B or FIGS. 2A and 2B is applied to the output stage shown in FIG. 11. FIGS. 1A and 1B schematically show a structure along L-shaped line I–I'. FIGS. 2A and 2B schematically show a structure along straight line II–II'. In FIG. 12, each of a plurality of lines 73 is formed of the first conductive layer 11 (FIGS. 1A, 1B, 2A and 2B) and corresponds to each signal line 62, signal line 66 or signal line 72. Each of a plurality of lines 74 is formed of the second conductive layer 13 (FIGS. 1A, 1B, 2A and 2B) and corresponds to each address signal line 61, video signal line 65 or voltage signal line 71. The openings 12a are formed in the interlayer insulative layer 12 provided between the first and second conductive layers 11 and 13.

As apparent from the comparison between the line pattern shown in FIG. 12 and the conventional line pattern shown in FIG. 15, the pitch of the second conductive layers 113 is at least 5λ (λ: alignment margin) in FIG. 15, whereas the pitch of the lines 73 is reduced to 4λ (=width 2λ of the line 73+distance λ between the opening 12a and the line 73+alignment margin λ for positioning the line 73 with respect to the opening 12a). This alleviates one of factors which restrict the line pitch in a driving circuit. Thus, the pitch of the output stages is allowed to be set as equal to the pitch of the pixel electrodes. As a result, the area of the signal line driving circuit 57 is reduced.

In the case where the liquid crystal display device 400 includes the polysilicon thin film transistors. 60 in correspondence with the pixel electrodes 53, the effect realized by the reduction in the line pitch is significant because the polysilicon thin film transistors and accompanying lines have inevitably large sizes compared to integrated circuits on a single crystalline silicon substrate.

According to the semiconductor device including the connection structure of the present invention, the opening formed in the interlayer insulative layer is sufficiently larger than the connection section including an area of the first conductive layer and an area of the second conductive layer. Therefore, the margin for positioning the first conductive layer with respect to the opening, and the margin for positioning the second conductive layer with respect to the opening, are not necessary. This allows the connection section to be reduced in size by the margin. Moreover, the sufficiently large opening significantly reduces the defective connection caused by the insufficient opening.

According to a method for producing the semiconductor device of the present invention, an area of the first conductive layer in the opening and an area of the second conductive layer in the opening are patterned in one patterning step. Therefore, the production process is shortened. In the case where an anodized first conductive layer needs to be divided into a plurality of portions, the first conductive layer is divided in the step of patterning the second conductive layer at the opening. Thus, a special step for dividing the first conductive layer is not necessary, which shortens the production process.

A liquid crystal display device according to the present invention includes the above-described connection structure. Therefore, lines and various elements are provided at a high density. For example, the pitch of the output stages is allowed to be set as equal to the pitch of the pixel electrodes.

In the above example, a liquid crystal display device has been described as an example. The present invention is applicable to other types of display devices including displays using other electrooptical materials than liquid crystal materials (e.g., an electro-luminescence (EL) display and a light emitting diode (LED) display) and a plasma display which require fine pitch assembly.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:
a first conductive layer;
an interlayer insulative layer having an opening; and
a second conductive layer,
wherein:
the first conductive layer, the interlayer insulative layer and the second conductive layer are sequentially laminated, and the second conductive layer is connected to the first conductive layer through the opening,
the opening is only partially covered, proximate a base of the opening, by the second conductive layer, and an area of the first conductive layer is substantially entirely covered by the second conductive layer in the opening, and wherein the second conductive layer in the opening is substantially located only in an area above the first conductive layer.

2. A display device having a connection structure, the connection structure comprising:
a first conductive layer;
an interlayer insulative layer having an opening; and
a second conductive layer,
wherein:
the first conductive layer, the interlayer insulative layer and the second conductive layer are sequentially laminated, and the second conductive layer is connected to the first conductive layer through the opening,
the opening is only partially covered, proximate a base of the opening, by the second conductive layer, and an area of the first conductive layer is substantially entirely covered by the second conductive layer in the opening, and wherein the first conductive layer and the second conductive layer are formed of a metal material; and
wherein the second conductive layer in the opening is substantially located only in an area above the first conductive layer.

3. A semiconductor device according to claim 1, wherein a connection section in which an area of the first conductive layer and an area of the second conductive layer which are connected to each other has a smaller planar size than a planar size of the opening.

4. A semiconductor device according to claim 1, wherein the second conductive layer covers at least a part of a periphery of the opening.

5. A semiconductor device according to claim 1, wherein the first conductive layer and the second conductive layer are formed of a metal material.

6. A display device according to claim 2, including:
- a first substrate including a plurality of scanning lines, a plurality of signal lines, a plurality of pixel electrodes respectively provided at intersections of the scanning lines and the signal lines, and a plurality of switching elements respectively for connecting the pixel electrodes to the scanning lines and the signal lines;
- a second substrate including a counter electrode;
- a liquid crystal layer interposed between the first substrate and the second substrate; and
- a driving circuit for supplying a voltage to the plurality of pixel electrodes-and the counter electrode to drive the liquid crystal layer,
- wherein the plurality of scanning lines are formed of the first conductive layer and have an anodized layer on at least a part of a side surface thereof.

7. A display device according to claim 6, wherein the driving circuit is provided on the first substrate and includes the connection structure.

8. The semiconductor device of claim 1, wherein at least one portion of an edge of the opening is not covered by the second conductive layer.

9. The semiconductor device of claim 1, wherein at least one portion of an upper edge of the opening is not covered by the second conductive layer.

10. The display device of claim 2, wherein at least one portion of an upper edge of the opening is not covered by the second conductive layer.

11. The display of claim 7, wherein a connection section in which an area of the first conductive layer and an area of the second conductive layer which are connected to each other has a smaller planar size than a planar size of the opening.

* * * * *